(12) United States Patent
Foong et al.

(10) Patent No.: US 8,049,313 B2
(45) Date of Patent: Nov. 1, 2011

(54) HEAT SPREADER FOR SEMICONDUCTOR PACKAGE

(75) Inventors: Chee Seng Foong, Sg. Buloh (MY); Kim Chiew Ho, Batu Caves (MY)

(73) Assignee: Freescale Semiconductor, Inc., Austin, TX (US)

( * ) Notice: Subject to any disclaimer, the term of this patent is extended or adjusted under 35 U.S.C. 154(b) by 70 days.

(21) Appl. No.: 11/533,410

(22) Filed: Sep. 20, 2006

(65) Prior Publication Data

US 2008/0067645 A1    Mar. 20, 2008

(51) Int. Cl.
*H01L 23/495* (2006.01)

(52) U.S. Cl. .............. 257/675; 257/706; 257/E33.075

(58) Field of Classification Search ............. 257/666, 257/675
See application file for complete search history.

(56) References Cited

U.S. PATENT DOCUMENTS

| | | | |
|---|---|---|---|
| 5,977,626 A | 11/1999 | Wang et al. | |
| 5,982,621 A | 11/1999 | Li | |
| 6,853,070 B2 | 2/2005 | Khan et al. | |
| 7,126,218 B1 | 10/2006 | Darveaux | |
| 7,323,769 B2 * | 1/2008 | Tan et al. | 257/684 |
| 2002/0171144 A1 | 11/2002 | Zhang et al. | |
| 2003/0057550 A1 | 3/2003 | Zhao et al. | |
| 2003/0179549 A1 | 9/2003 | Zhong et al. | |
| 2005/0285258 A1 | 12/2005 | Chen | |
| 2006/0063306 A1 | 3/2006 | Choi | |
| 2006/0081978 A1 | 4/2006 | Huang et al. | |
| 2006/0087015 A1 | 4/2006 | Yuan et al. | |
| 2006/0109630 A1 | 5/2006 | Colgan et al. | |
| 2006/0125089 A1 | 6/2006 | Tatt et al. | |
| 2006/0145316 A1 | 7/2006 | Kim et al. | |
| 2006/0145320 A1 | 7/2006 | Vogt | |
| 2006/0166397 A1 | 7/2006 | Lau et al. | |
| 2006/0170080 A1 | 8/2006 | Zuniga-Ortiz et al. | |
| 2006/0170094 A1 | 8/2006 | Subramanian et al. | |
| 2008/0042302 A1 * | 2/2008 | Crispell et al. | 257/796 |

* cited by examiner

*Primary Examiner* — Quoc Hoang
*Assistant Examiner* — Tony Tran
(74) *Attorney, Agent, or Firm* — Charles Bergere

(57) ABSTRACT

A heat spreader (50) for a semiconductor package (100) includes a heat dissipating portion (52) having a recessed periphery (54). A thermosetting resin (58) is disposed in the recessed periphery (54). The heat spreader (50) may include a heat absorbing portion (56) coupled to the heat dissipating portion (52).

7 Claims, 3 Drawing Sheets

HEAT SPREADER FOR SEMICONDUCTOR PACKAGE

BACKGROUND OF THE INVENTION

The present invention relates to the packaging of integrated circuits (ICs) and more particularly to a heat spreader for a semiconductor package and a method of forming a semiconductor package with such a heat spreader.

Heat is generated by an IC die during operation. If inadequately removed, the heat generated by the die may cause the device to fail. As such, heat spreaders are often incorporated into semiconductor packages to improve the thermal performance of the package. For optimal thermal conduction, a heat spreader should ideally be attached to an IC die to provide a direct path for the heat from the die. Consequently, a number of semiconductor packages with heat spreaders attached to IC die surfaces have been proposed. A typical example of one such semiconductor package is described below with reference to FIG. 1.

FIG. 1 shows a conventional semiconductor package 10 having a stacked-on heat spreader 12. The semiconductor package 10 includes an IC die 14 having a bottom surface 16 attached to a substrate 18 with an adhesive material 20. The IC die 14 is electrically connected to the substrate 18 with a plurality of wires 22. The heat spreader 12 is attached to a top surface 24 of the IC die 14 with a thermal adhesive 26. A portion of the heat spreader 12, the IC die 14, a portion of the substrate 18 and the wires 22 are covered by a mold compound 28. To prevent bleeding or flashing of the mold compound 28 during mold transfer, which renders the heat spreader 12 ineffective, a significant clamping force (represented by bold arrows in FIG. 1) is exerted by a mold chase 30 on the heat spreader 12 during a molding operation. Because the heat spreader 12 is attached to the IC die 14, the clamping force exerted by the mold chase 30 on the heat spreader 12 is transmitted to the IC die 14. Consequently, the top surface 24 of the IC die 14 experiences significant compressive stress during the molding operation, which can cause the IC die 14 to crack. Thus, there is a need for a way to reliably manufacture semiconductor packages with heat spreaders attached to IC die surfaces.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
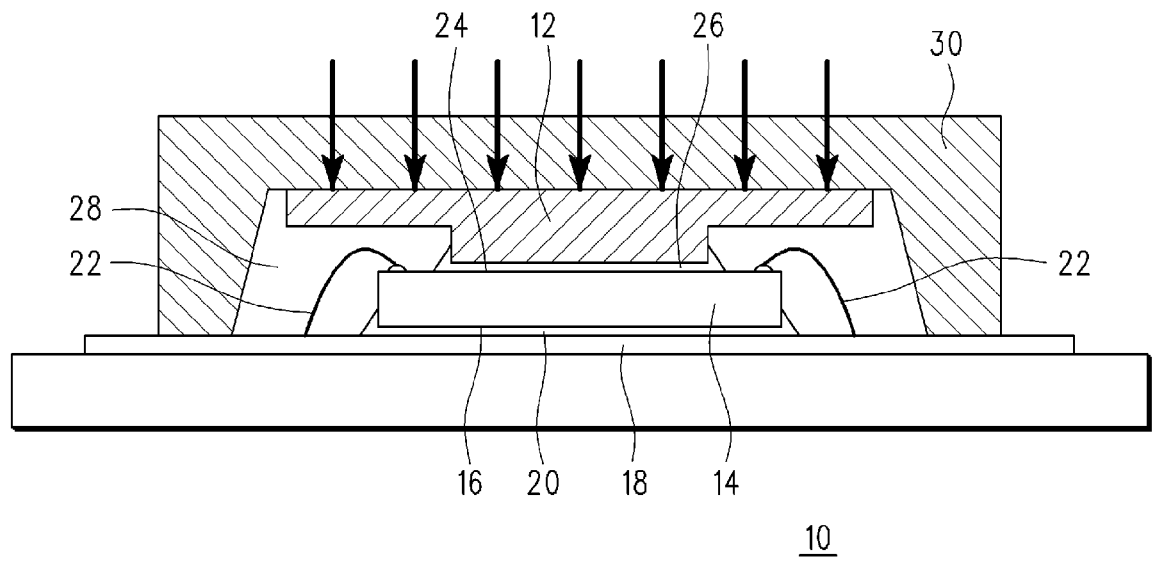
FIG. 1 is an enlarged cross-sectional view of a conventional semiconductor package having a stack-on heat spreader.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a heat spreader for a semiconductor package. The heat spreader includes a heat dissipating portion having a recessed periphery, and a thermosetting resin disposed in the recessed periphery.

The present invention also provides a semiconductor package including a substrate and an IC die attached on a first surface to the substrate. The IC die is electrically connected to the substrate. A heat spreader is attached to a second surface of the IC die. The heat spreader includes a heat dissipating portion having a recessed periphery, and a thermosetting resin disposed in the recessed periphery.

The present invention further provides a method of forming a semiconductor package including the steps of attaching a first surface of an IC die to a substrate, and electrically connecting the IC die to the substrate. A heat spreader is attached to a second surface of the IC die. The heat spreader includes a heat dissipating portion with a recessed periphery and a thermosetting resin disposed in the recessed periphery. The IC die and the heat spreader are placed in a mold chase such that the mold chase contacts the thermosetting resin disposed in the recessed periphery of the heat dissipating portion of the heat spreader. The thermosetting resin is cured to form a hermetic seal between the heat spreader and the mold chase. The IC die, a portion of the substrate and a portion of the heat spreader are covered with a mold compound.

Figure 2:
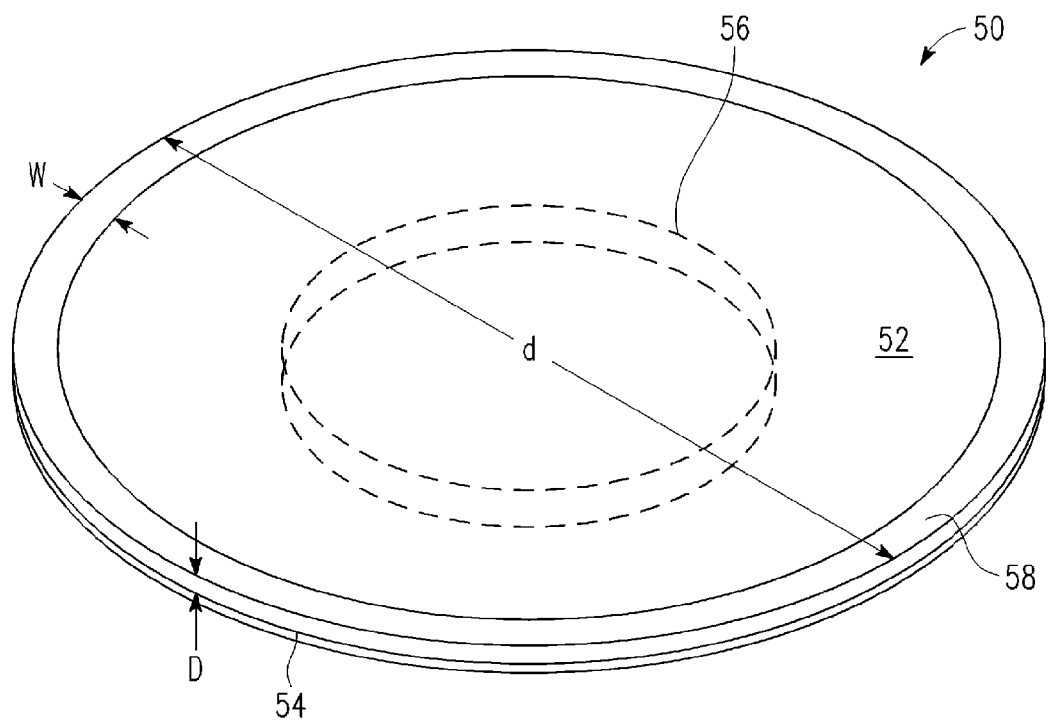
FIG. 2 is an enlarged top perspective view of a heat spreader in accordance with an embodiment of the present invention.
Figure 3:
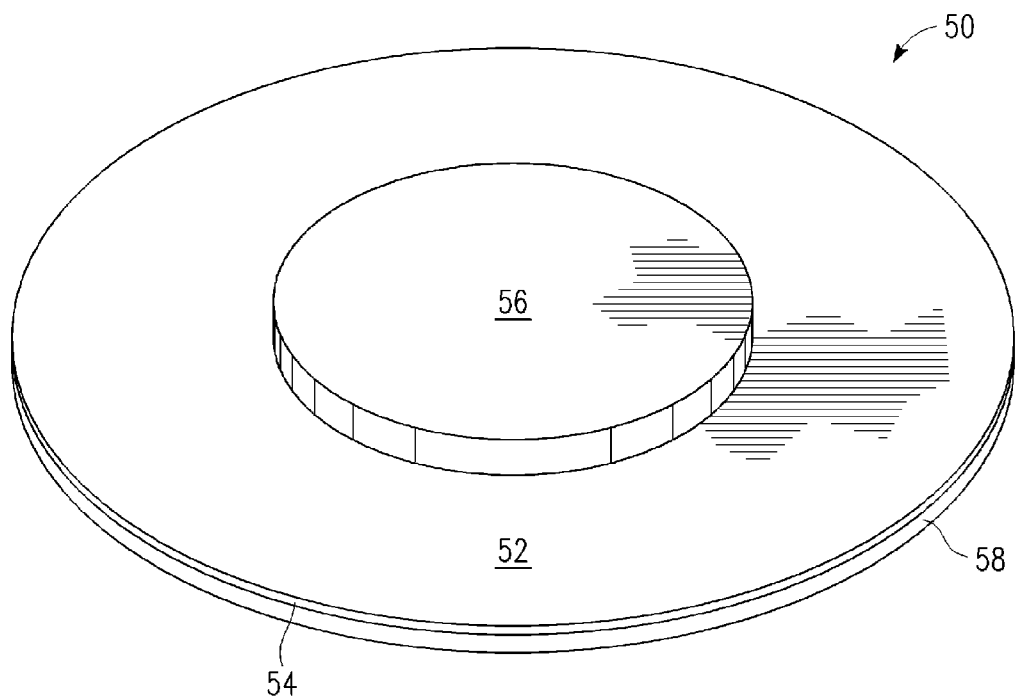
FIG. 3 is an enlarged bottom perspective view of the heat spreader of FIG. 2.

FIGS. 2 and 3 show perspective views of a heat spreader 50 for a semiconductor package. More particularly, FIG. 2 shows a top perspective view of the heat spreader 50, while FIG. 3 shows a bottom perspective view of the heat spreader 50. The heat spreader 50 includes a heat dissipating portion 52 having a recessed periphery 54, and a heat absorbing portion 56 coupled to the heat dissipating portion 52. A thermosetting resin 58 is disposed in the recessed periphery 54 of the heat dissipating portion 52 of the heat spreader 50.

The heat spreader 50 is sized to fit over an IC die. For example, a heat spreader 50 having a diameter d of about 21 millimeters (mm) may be used with an IC die measuring 5 mm by 5 mm. Sizing the heat spreader 50 greater than the IC die allows room for wire bonds and encapsulation. Moreover, the size of the heat spreader 50 allows for good placement tolerance. As can be seen, the heat spreader 50 of the present embodiment is circular in shape. Nonetheless, it should be understood that the present invention is not limited to round-shaped heat spreaders 50. The heat spreader 50 may, for example, be square-shaped in another embodiment. The heat spreader 50 may be made of copper or other thermally conductive material. In one embodiment, the heat spreader 50 is made by stamping and/or etching. Because the heat spreader 50 is a relatively simply shaped, it can be manufactured with ease and is easily handled during assembly. The recessed periphery 54 of the heat dissipating portion 52 of the heat spreader 50 may be formed by stamping and/or etching. In one embodiment, the recessed periphery 54 has a width W of between about 1 mm to about 2.5 mm, and a depth D of between about 0.1 mm to about 0.2 mm. However, those of skill in the art will understand that the present invention is not limited by the dimensions of the recessed periphery 54.

The thermosetting resin 58 is a partially cured or B-stage resin such as, for example, Shin-Etsu SEMICOAT 513, Ablestik ABLEFLEX 6202C or Ablestik ABLEFLEX 8006NS. In one embodiment, the thermosetting resin 58 is a partially cured or B-stage epoxy having a cure temperature of between about 100 degree Celsius (° C.) to about 200° C., and a cure period of between about 5 seconds to about 10 seconds. However, it should be understood that the present invention is not limited by the chemical composition of the thermosetting resin 58 or to a specific cure state of the thermosetting resin 58. The thermosetting resin 58 may be applied to the recessed periphery 54 via a printing process.

A method of forming a semiconductor package with the heat spreader 50 of FIGS. 2 and 3 will now be described below with reference to FIGS. 4 and 5.

Figure 4:
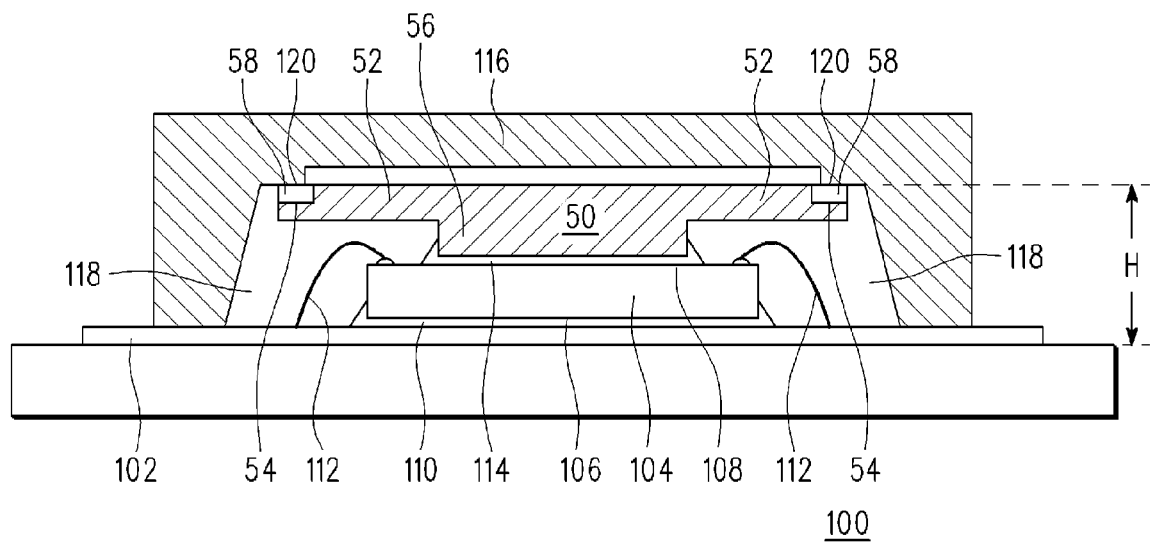
FIG. 4 is an enlarged cross-sectional view of a semiconductor package having the heat spreader of FIGS. 2 and 3.

FIG. 4 illustrates the formation of a semiconductor package 100 having the heat spreader 50 of FIGS. 2 and 3. The semiconductor package 100 includes a substrate 102 and an IC die 104 having a bottom or first surface 106 attached to the substrate 102. The IC die 104 also is electrically connected to the substrate 102. The heat spreader 50 is attached to a top or second surface 108 of the IC die 104. As previously described, the heat spreader 50 includes the heat dissipating portion 52 having the recessed periphery 54, and the heat absorbing portion 56 coupled to the heat dissipating portion 52. The thermosetting resin 58 is pre-disposed in the recessed periphery 54 of the heat dissipating portion 52 during fabrication.

Figure 5:
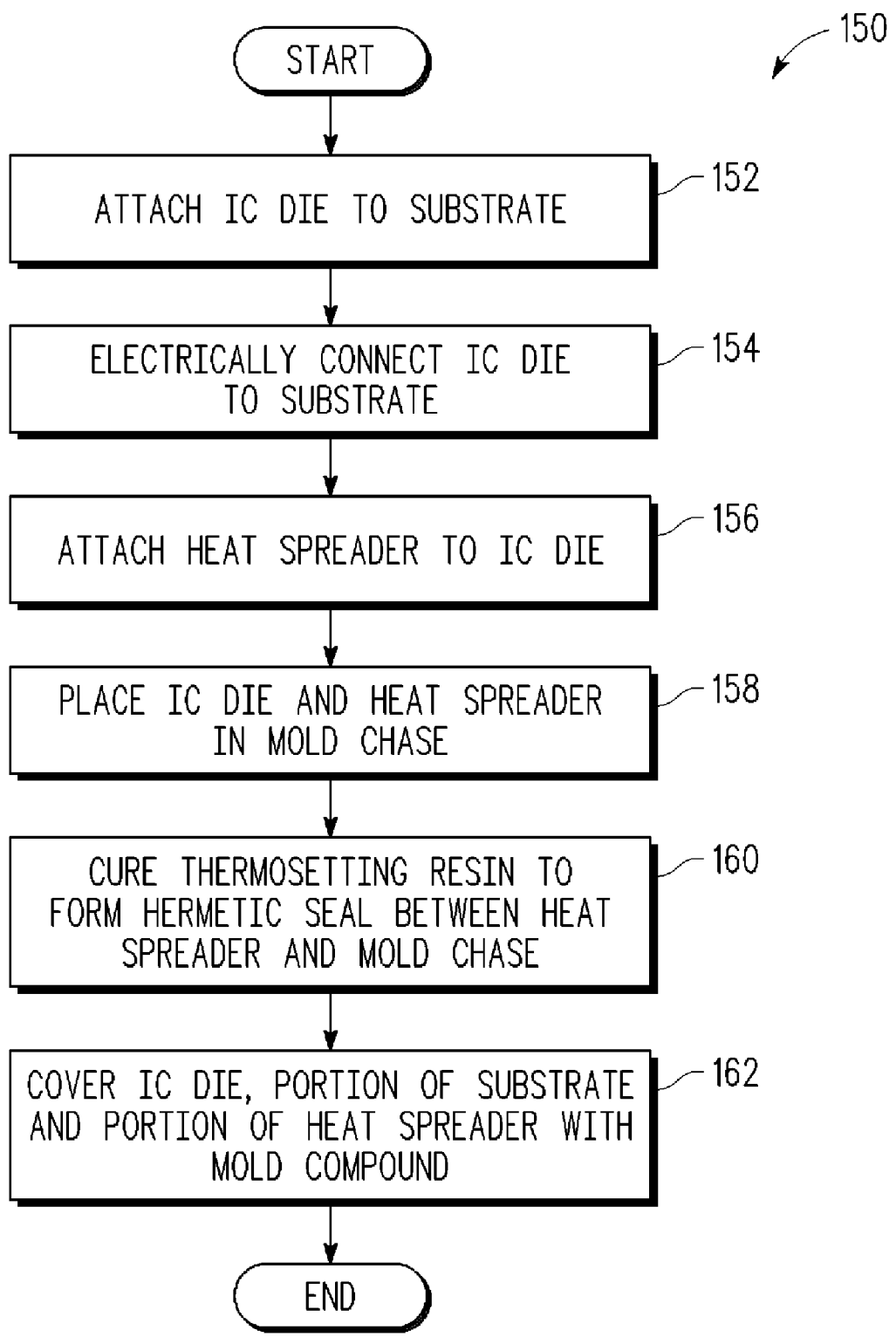
FIG. 5 is a flowchart depicting a method of forming the semiconductor package of FIG. 4.

In FIG. 5, which is a flow chart of a method 150 of forming the semiconductor package 100 of FIG. 4, step 152 indicates the attachment of the bottom or first surface 106 of the IC die 104 to the substrate 102, step 154 indicates the electrical connection of the IC die 104 to the substrate 102, and step 156 indicates the attachment of the heat spreader 50 to the top or second surface 108 of the IC die 104.

The substrate 102 provides the semiconductor package 100 with mechanical base support and serves as an electrical interface to the IC die 104. The substrate 102 and the IC die 104 are of types well known to those of ordinary skill in the art, such as a Bismaleimide-Triazine (BT) substrate, a processor chip, an application specific integrated circuit (ASIC), etc. Accordingly, further description of these components is not required for a complete understanding of the present invention. The IC die 104 is attached to the substrate 102 at step 152 in a known manner, in this instance, with an adhesive material layer 110. In the present embodiment, the IC die 104 is electrically connected to the substrate 102 at step 154 via a plurality of wires 112. The wires 112 may be made of gold (Au), copper (Cu), aluminum (Al) or other electrically conductive materials as are known in the art and commercially available.

In the present embodiment, the heat absorbing portion 56 of the heat spreader 50 is attached to the second surface 108 of the IC die 104 at step 156. Accordingly, the heat spreader 50 provides a direct heat transfer path facilitating the conduction of heat from the IC die 104 to the outside of the package, thereby improving package thermal performance. Further, because the heat spreader 50 is attached to the IC die 104, and not the substrate 102, conventional substrates may be used as there are no limitations on the routing of traces or positioning of wire bond pads on the substrate 102. To facilitate heat transfer, the heat spreader 50 preferably is attached to the IC die 104 at step 156 with a thermal adhesive 114 such as, for example, a silver-filled epoxy in a known manner using existing equipment and processes.

At step 158, the IC die 104 and the heat spreader 50 are placed in a mold chase 116. More particularly, the mold chase 116 is lowered over the IC die 104 and the heat spreader 50 at step 158. As shown in FIG. 4, the mold chase 116 contacts the thermosetting resin 58 disposed in the recessed peripheries 54 of the heat spreader 50, but not the heat dissipating portion 52 of the heat spreader 50. In one embodiment of the invention, the mold chase 116 includes a cut-out central area that corresponds to the heat dissipating portion 52 of the heat spreader 50 so that the mold chase does not contact the heat dissipating portion 52 of the heat spreader 50. Thus, because the mold chase 116 does not contact the heat spreader 50, and also because the partially cured or B-stage thermosetting resin 58 is very soft, the clamping force exerted by the mold chase 116 is absorbed by the resin 58 and is not transmitted to the IC die 104. Therefore, die cracking due to the compressive stresses exerted by the mold chase 116 is eliminated.

The thermosetting resin 58 is cured at step 160 to form a hermetic seal between the heat spreader 50 and the mold chase 116. The hermetic seal formed therebetween prevents mold flash during mold transfer. In one embodiment, the thermosetting resin 58 is cured at a temperature of between about 100° C. to about 200° C. for a period of between about 5 seconds to about 10 seconds. Nonetheless, it should be understood that the present invention is not limited by the cure conditions applied to the thermosetting resin 58 at step 160. Rather, the cure conditions applied at step 160 are dependent on the chemical composition and cure state of the thermosetting resin 58.

At step 162, a portion of the heat spreader 50, a portion of the substrate 102, the IC die 104 and the wires 112 are covered with a mold compound 118. Step 162 may be performed with conventional transfer molding processes to reduce tooling investment. As shown in FIG. 4, the heat spreader 50 is molded flush to a top surface of the semiconductor package 100. A top surface of the heat spreader 50 is therefore exposed, facilitating the dissipation of heat from the heat spreader 50 to the ambient via conduction and convection. Apart from providing cooling capabilities, the heat spreader 50 also functions as a mold lock, thereby improving package rigidity. In one embodiment, the semiconductor package 100 has a height H of about 1.52 mm. However, it should be understood that the present invention is not limited by the height H of the semiconductor package 100. Rather, the package height H is governed by bond line thicknesses (BLTs) of the adhesive material layer 110 and the thermal adhesive 114.

On completion of the mold transfer process at step 162, the mold chase 116 is lifted off the semiconductor package 100. A plurality of solder balls (not shown) may then be attached to a bottom surface of the semiconductor package 100 using existing equipment and processes to form a wire-bonded Ball Grid Array (BGA) package. In the present embodiment, an inner surface 120 of the mold chase 116 is provided with a mirror-finish to prevent the thermosetting resin 58 from adhering to the mold chase 116.

Although FIG. 4 shows only one (1) IC die 104, it will be understood that more than one IC die may be packaged with the present invention, depending on the size of the substrate 102, the size of the IC dice, and the required functionality of the resulting semiconductor packaged device.

As is evident from the foregoing discussion, the present invention provides a heat spreader and a simple and inexpensive method for reliable volume production of thermally enhanced packages. Because a mold chase contacts a soft, partially cured thermosetting resin disposed in a recessed periphery of the heat spreader, but not the heat dissipating portion of the heat spreader, the clamping force exerted by the mold chase is not transmitted to the IC die. Die cracking due to the compressive stress exerted by the mold chase thus is eliminated. Additionally, because the partially cured thermosetting resin is fully cured to form a hermetic seal between the heat spreader and the mold chase prior to mold transfer, mold flash on the heat spreader is prevented.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. For example, although a side gate molded wire bonded BGA package is described above, the present invention is not limited to such packages or molding processes. The present invention can also be applied to center gate molded packages, flip chip packages, and other package families, for example, Multi-Array BGA (MAPBGA), Quad Flat Pack (QFP) and Quad Flat No Lead (QFN) packages. Additionally, the IC die and substrate sizes may vary to accommodate the required package design. It is understood, therefore, that this invention is not limited to the particular embodiments disclosed, but covers modifications within the spirit and scope of the present invention as defined by the appended claims.

The invention claimed is:

1. A semiconductor package, comprising:
   a substrate;
   an IC die attached on a first surface to the substrate and electrically connected to the substrate; and
   a heat spreader attached to a second surface of the IC die, the heat spreader comprising:
   a heat absorbing portion attached to the second surface of the IC die,
   a heat dissipating portion having a bottom surface that faces the substrate and a top surface opposite to the bottom surface, wherein the top surface has a recessed periphery, wherein a central portion of the bottom surface is coupled to the heat absorbing portion, and wherein the heat spreader has a generally T-shaped cross-section with the heat absorbing portion forming a vertical base portion of the T-shape and the heat dissipating portion forming a horizontal portion of the T-shape, and
   a first mold compound comprising a thermosetting resin disposed in the recessed periphery for preventing die cracking during a later performed molding operation, and
   a second mold compound covering the IC die, a portion of the substrate and a portion of the heat spreader, wherein the top surface of the heat spreader is exposed.

2. The semiconductor package of claim 1, wherein the thermosetting resin has a cure temperature of between about 100° C. to about 200° C.

3. The semiconductor package of claim 2, wherein the thermosetting resin has a cure period of between about 0.5 hr to about 2 hrs.

4. The semiconductor package of claim 1, wherein the recessed periphery has a width of between about 1.0 mm to about 2.5 mm.

5. The semiconductor package of claim 4, wherein the recessed periphery has a depth of between about 0.1 mm to about 0.2 mm.

6. A semiconductor package, comprising:
   a substrate;
   an IC die attached on a first surface to the substrate and electrically connected to the substrate;
   a heat spreader attached to a second surface of the IC die, the heat spreader comprising:
   a heat absorbing portion attached to the second surface of the IC die,
   a heat dissipating portion having a bottom surface that faces the substrate and a top surface opposite to the bottom surface, wherein the top surface has a recessed periphery, wherein a central portion of the bottom surface is coupled to the heat absorbing portion, and wherein the heat spreader has a generally T-shaped cross-section with the heat absorbing portion forming a vertical base portion of the T-shape and the heat dissipating portion forming a horizontal portion of the T-shape, and
   a first mold compound disposed in the recessed periphery for preventing die cracking during a molding operation; and
   a second mold compound, different from the first mold compound, covering the IC die, a portion of the substrate and a portion of the heat spreader, wherein the top surface of the heat spreader is exposed.

7. The semiconductor package of claim 6, wherein the first mold compound comprises a thermosetting resin.

* * * * *